US008723316B2

(12) United States Patent
Chen et al.

(10) Patent No.: US 8,723,316 B2
(45) Date of Patent: May 13, 2014

(54) CHIP PACKAGE STRUCTURE USING FLEXIBLE SUBSTRATE

(75) Inventors: Wei-Ming Chen, Hsinchu (TW); Chi-Chia Huang, Hsinchu (TW)

(73) Assignee: ChipMOS Technologies Inc., Hsinchu (TW)

(*) Notice: Subject to any disclaimer, the term of this patent is extended or adjusted under 35 U.S.C. 154(b) by 0 days.

(21) Appl. No.: 13/481,881

(22) Filed: May 28, 2012

(65) Prior Publication Data
US 2013/0032939 A1    Feb. 7, 2013

(30) Foreign Application Priority Data
Aug. 4, 2011  (TW) .............................. 100127738 A

(51) Int. Cl.
*H01L 23/48* (2006.01)
*H01L 23/52* (2006.01)

(52) U.S. Cl.
USPC .......................................................... 257/737

(58) Field of Classification Search
USPC .......................................................... 257/737
See application file for complete search history.

(56) References Cited

U.S. PATENT DOCUMENTS

| 6,208,525 | B1* | 3/2001 | Imasu et al. | ............... 361/783 |
| 6,573,459 | B2 | 6/2003 | Baker et al. | |
| 2006/0215377 | A1 | 9/2006 | Nomura et al. | |
| 2011/0169033 | A1* | 7/2011 | Fukunaga et al. | ............... 257/98 |

FOREIGN PATENT DOCUMENTS

| JP | 2003-142535 | | 5/2003 |
| JP | 2003142535 A | * | 5/2003 |
| TW | 418467 | | 1/2001 |
| TW | 200818442 | | 4/2008 |
| TW | 200824076 | | 6/2008 |
| TW | 200830484 | | 7/2008 |

OTHER PUBLICATIONS

"Office Action of Taiwan Counterpart Application", issued on Dec. 23, 2013, p. 1-p. 6, in which the listed references were cited.

* cited by examiner

*Primary Examiner* — Anthony Ho
(74) *Attorney, Agent, or Firm* — Jianq Chyun IP Office

(57) ABSTRACT

A chip package structure includes a flexible substrate having a chip mounting region, a plurality of leads disposed on the flexible substrate, an insulating layer and a chip. Each lead includes a body portion and an inner lead portion connected to each other. The body portion is located outside the chip mounting region and has a thickness greater than that of the inner lead portion. The insulating layer is disposed on the inner lead portions. The chip has an active surface on which a plurality of bumps and a seal ring adjacent to the chip edges are disposed. The chip is mounted within the chip mounting region and electrically connects the flexible substrate by connecting the inner lead portions of the leads with the bumps. The insulating layer is corresponding to the seal ring in position when the chip is electrically connected to the flexible substrate.

10 Claims, 6 Drawing Sheets

CHIP PACKAGE STRUCTURE USING FLEXIBLE SUBSTRATE

CROSS-REFERENCE TO RELATED APPLICATION

This application claims the priority benefit of Taiwan application Ser. No. 100127738, filed on Aug. 4, 2011. The entirety of the above-mentioned patent application is hereby incorporated by reference herein and made a part of this specification.

BACKGROUND OF THE INVENTION

1. Field of the Invention

The invention generally relates to a chip package structure, and more particularly, to a chip package structure using a flexible substrate.

2. Description of Related Art

With the advancement in semiconductor technology, liquid crystal displays (LCDs) now are provided with the advantages such as low power consumption rate, compactness, high resolution, high color saturation, long life-span and so on. Consequently, liquid crystal displays can be widely applied in daily electronic products such as monitors of laptop or desktop computers, televisions, and the like. Moreover, the driver integrated circuits (IC) are the indispensible elements for the liquid crystal displays to operate.

To satisfy the demands for various applications of the LCD driver IC chips, the chips are usually packaged by using tape automatic bonding (TAB) package technique. The TAB technique is categorized into the chip-on-film (COF) package and the tape carrier package (TCP).

Referring to FIG. 1, in more details, in the TAB packaging, after the flexible substrate 50 is provided with traces/leads and the chip 60 with a plurality of bumps 62 thereupon, the chip 60 is placed on a stage 10 and the flexible substrate 50 is placed over the chip 60, and thermocompression by a bonding head 20 is then performed to complete the inner lead bonding (ILB) process. Hence, the bumps 62 on the chip 60 and the inner leads 52 on the flexible substrate 50 are electrically connected to each other with eutectic bonding. During the thermocompression process, the chip edge touch issue may occur due to the warping or bending of the flexible substrate 50. That is to say, a seal/guard ring 80 disposed around the edge of the chip 60 would contact the inner leads 52 leading to electric failure problems like current leakage, bridging or short-circuit. In addition, the test keys disposed on the scribe lines of the semiconductor wafer may not be entirely removed in wafer dicing process so that residues of the test keys may remain at the edges of the chips 60. If the residues of the test keys bend over to form burrs 30, the burrs 30 remained at the edges of the chip 60 may contact the inner leads 52 when the flexible substrate 50 warps, leading to electric short-circuit.

The inner lead bonding (ILB) process can also be performed by another means as shown in FIG. 2 where the flexible substrate 50 is placed on the stage 10 and the chip 60 is mounted on the flexible substrate 50 by a bonding head 20 with thermocompression technique, so that the inner leads 52 and the bumps 62 are electrically connected to each other with eutectic bonding. In this means of bonding, any foreign materials 12 on the stage 10 may cause the flexible substrate 50 to hump or warp leading to undesired contact between the inner leads 52 and the seal/guard ring 80 or the burrs of the test keys (not shown) remained at the edge of the chip 60, which also induces the edge touch problem and leads to electric failure like current leakage, bridging or short-circuit.

SUMMARY OF THE INVENTION

Accordingly, the invention is directed to a chip package structure able to avoid unexpected electric contact between the chip and the leads.

The present invention provides a chip package structure, which includes a flexible substrate, a plurality of leads, an insulating layer and a chip. The flexible substrate has a chip mounting region. The leads are disposed on the flexible substrate, in which each of the leads includes a body portion and an inner lead portion connected to each other. The inner lead portion extends into the chip mounting region, and the body portion is located outside the chip mounting region and a thickness of the body portion is greater than a thickness of the inner lead portion. The insulating layer is disposed on the inner lead portions of the leads. The chip has an active surface on which a plurality of bumps and a seal ring are disposed. The seal ring is adjacent to the edges of the chip, and the chip is mounted within the chip mounting region and electrically connects the flexible substrate by connecting the inner lead portions of the leads with the bumps correspondingly. The insulating layer is corresponding to the seal ring in position when the chip is electrically connected to the flexible substrate.

In an embodiment of the present invention, the above-mentioned bumps are arranged abreast along at least two opposite edges of the chip and adjacent to the at least two opposite edges, and the seal ring is located between the bumps and the at least two opposite edges of the chip.

In an embodiment of the present invention, the above-mentioned insulating layer includes at least two insulating strips, and the at least two insulating strips are respectively disposed on the inner lead portions of the leads arranged abreast along the at least two opposite edges of the chip.

In an embodiment of the present invention, the above-mentioned insulating layer includes a plurality of insulating blocks and each of the insulating blocks is disposed on the inner lead portion of one of the leads.

In an embodiment of the present invention, the above-mentioned chip package structure further includes an encapsulant disposed between the chip and the flexible substrate to cover the bumps and the seal ring.

In an embodiment of the present invention, the above-mentioned chip package structure further includes a solder resist layer located outside the chip mounting region and partially covering the body portions of the leads.

In an embodiment of the present invention, a joint between the above-mentioned body portion and inner lead portion has a sidewall surface, and the insulating layer extends onto and is disposed on the sidewall surface.

In an embodiment of the present invention, the thickness of the above-mentioned body portion is 1.2 to 2 times larger than that of the inner lead portion.

In an embodiment of the present invention, the height of the above-mentioned bumps is greater than the thickness sum of the seal ring and the insulating layer.

In an embodiment of the present invention, the above-mentioned flexible substrate is suitable for chip-on-film (COF) package or tape carrier package (TCP).

Based on the description above, the lead in the present invention with the thicker body portion and an insulating layer disposed on the inner lead portion reinforces the structure strength of the lead and reduces the probability of lead bending caused by bonding force. In addition, the insulating layer is corresponding to the seal ring on the chip in position and interposed between the leads and the seal ring such that the unexpected electric contact between the leads and the seal ring due to the warpage of the flexible substrate and the lead bending can be avoided so as to reduce the probability of short-circuit of the chip package structure.

Other objectives, features and advantages of the present invention will be further understood from the further technological features disclosed by the embodiments of the present invention wherein there are shown and described preferred embodiments of this invention, simply by way of illustration of modes best suited to carry out the invention.

DESCRIPTION OF THE EMBODIMENTS

Figure 1:
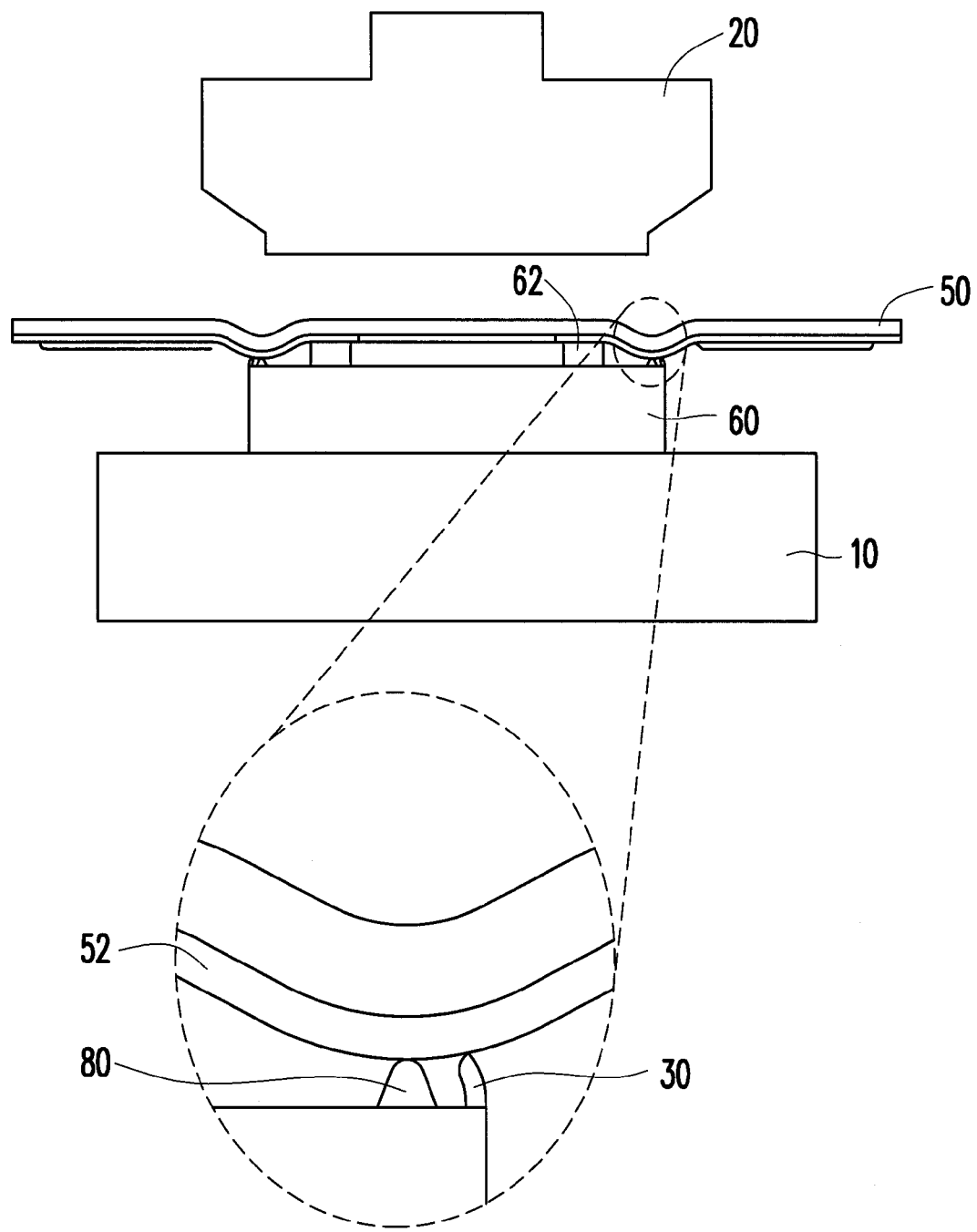
FIGS. 1 and 2 are two schematic diagrams illustrating two different processes for fabricating a conventional tape automatic bonding package structure.
Figure 2:
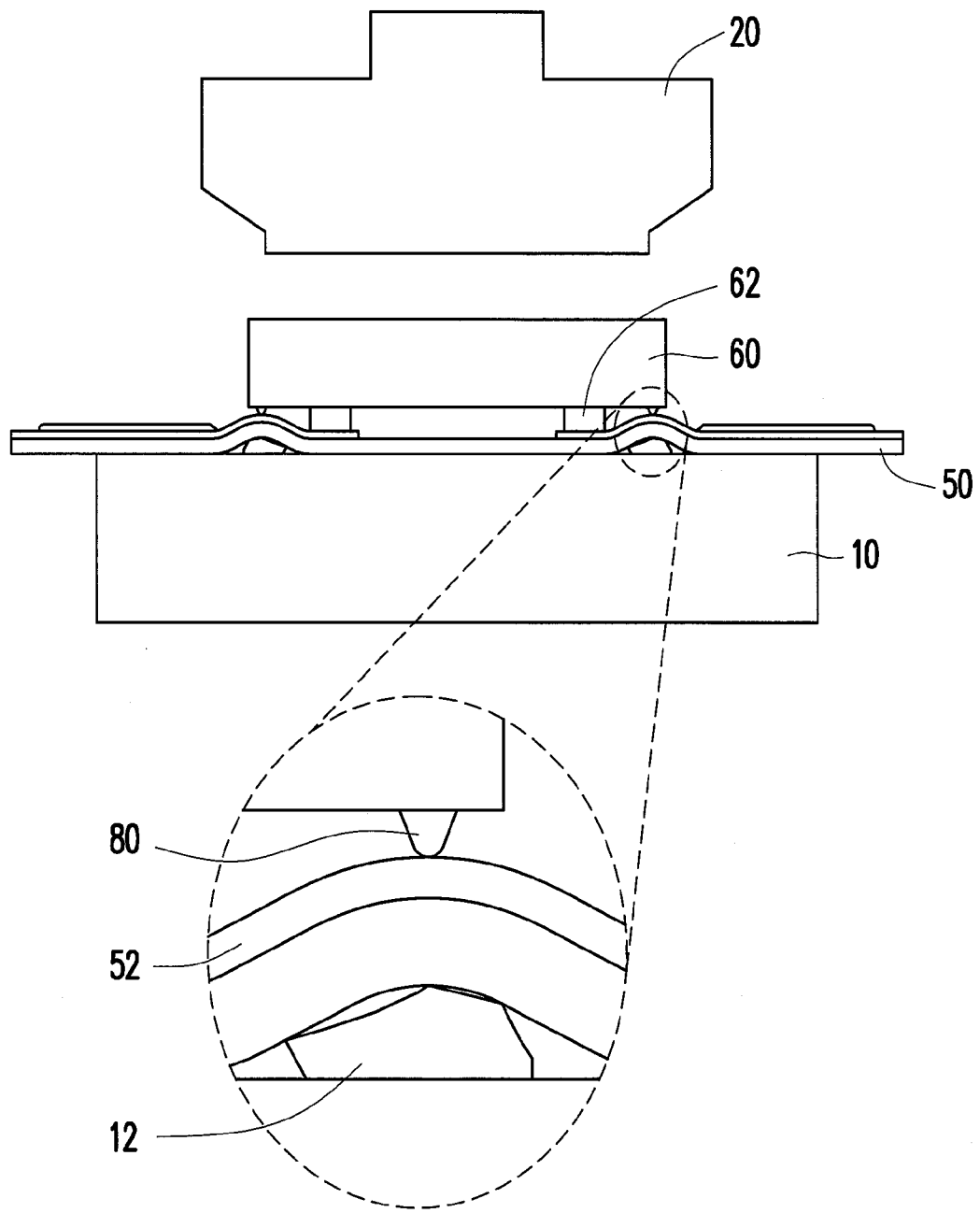
Figure 3:
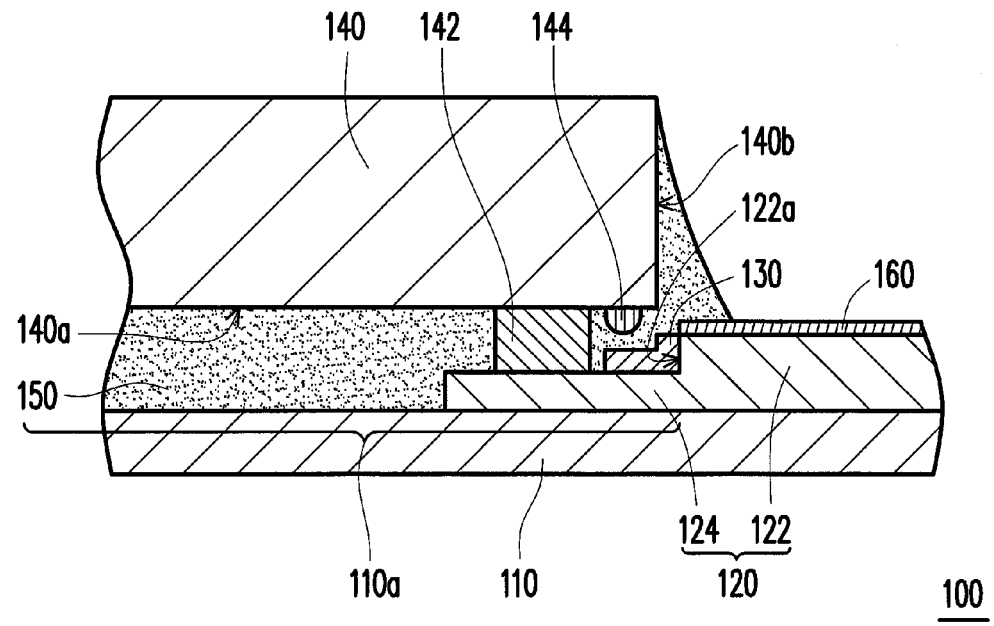
FIG. 3 is a partial cross-sectional diagram of a chip package structure in an embodiment of the invention.

FIG. 3 is a partial cross-sectional diagram of a chip package structure in an embodiment of the invention. As depicted in FIG. 3, a chip package structure 100 in the embodiment includes a flexible substrate 110, a plurality of leads 120 (only one of which is shown in FIG. 3) and a chip 140. The leads 120 are disposed on the flexible substrate 110 and the chip 140 is electrically connected to the flexible substrate 110 through the leads 120. The chip package structure 100 of the embodiment is, for example, but not limited to, a COF package. In addition to the COF package, the flexible substrate 110 is also suitable for a TCP structure.

In more details, the flexible substrate 110 has a chip mounting region 110a and each of the leads 120 includes a body portion 122 and an inner lead portion 124 connected to each other. The inner lead portion 124 is also referred to as the inner lead. The inner lead portion 124 of the lead 120 extends into the chip mounting region 110a, the body portion 122 of the lead 120 is located outside the chip mounting region 110a and the thickness of the body portion 122 is greater than the thickness of the inner lead portion 124. The chip 140 has an active surface 140a, on which a plurality of bumps 142 (only one of which is shown in FIG. 3) and a seal ring 144 are disposed. The chip 140 is mounted within the chip mounting region 110a and electrically connected to the flexible substrate 110 by connecting the inner lead portions 124 of the leads 120 with the bumps 142 correspondingly. The seal ring 144 is located adjacent to the edges of the chip 140 and serves as a protection measure to prevent the chip 140 from electromagnetic interference (EMI) (for example, electrostatic discharge). The chip package structure 100 further includes an insulating layer 130, which is disposed on the inner lead portions 124 of the leads 120. When the chip 140 is electrically connected to the flexible substrate 110, the insulating layer 130 is corresponding to the seal ring 144 in position.

With the above-mentioned layout, since the body portion 122 of the lead 120 has a larger thickness, the structure strength of the leads 120 is reinforced and the probability of the lead bending caused by the bonding force is reduced. In addition, by disposing the insulating layer 130 on the inner lead portions 124 of the leads 120 to have the insulating layer 130 corresponding to the seal ring 144 on the chip 140 in position, the insulating layer 130 is hence interposed between the leads 120 and the seal ring 144 when the chip 140 is bonded to the flexible substrate 110. Therefore, unexpected electric contact between the leads 120 and the seal ring 144 due to warping of the flexible substrate 110 and the bending of the leads 120 can be avoided so that the probability of short-circuit of the chip package structure 100 is reduced.

Figure 4:
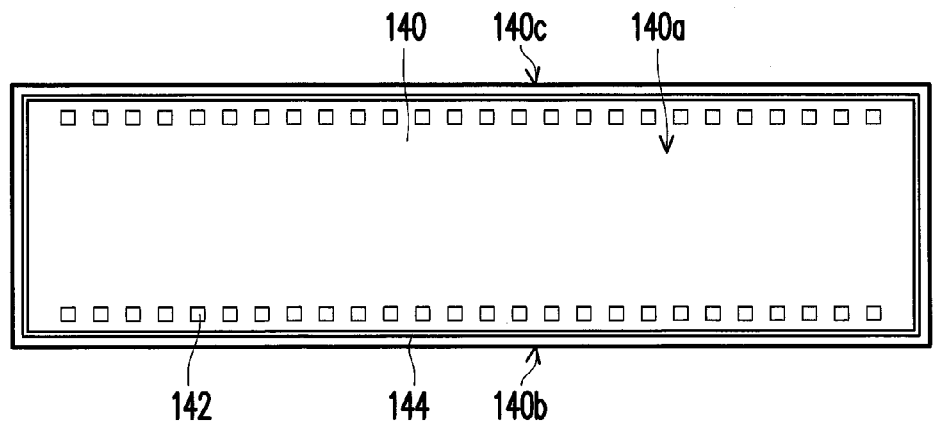
FIG. 4 is a bottom view diagram of the chip shown in FIG. 3.

In more details, in the embodiment, a joint between the body portion 122 and the inner lead portion 124 has a sidewall surface 122a, and the insulating layer 130 extends onto and is disposed on the sidewall surfaces 122a of the leads 120. FIG. 4 is a bottom view diagram of the chip shown in FIG. 3. Referring to FIGS. 3 and 4, in the embodiment, the bumps 142 are arranged abreast along two opposite edges 140b and 140c of the chip 140 and adjacent to the edges 140b and 140c. The seal ring 144 is located between the bumps 142 and the edges 140b and 140c of the chip 140 and serves as a protection measure to prevent the chip 140 from EMI (for example, electrostatic discharge). In the embodiment, the seal ring 144 goes around the four edges of the chip 140; however, the extent and the shape of the seal ring 144 are not limited to the above-mentioned design.

In the embodiment, the thickness of the body portion 122 is, for example, 1.2 to 2 times larger than that of the inner lead portion 124 so as to effectively reinforce the structure strength of the leads 120. In addition, the body portions 122 of the leads 120 do not overlap with the chip 140 and the height of the bumps 142 is greater than the thickness sum of the seal ring 144 and the insulating layer 130 to avoid poor bonding between the bumps 142 and the inner lead portions 124 of the leads 120.

Referring to FIG. 3, the chip package structure 100 of the embodiment further includes an encapsulant 150, which is disposed between the chip 140 and the flexible substrate 110 to cover the bumps 142 and the seal ring 144. In addition, the chip package structure 100 further includes a solder resist layer 160, which is located outside the chip mounting region 110a and partially covers the body portions 122 of the leads 120 to prevent electric short-circuit due to inappropriate contact between the leads 120. In the embodiment, the chip mounting region 110a is defined by the opening of the solder resist layer 160.

Figure 5:
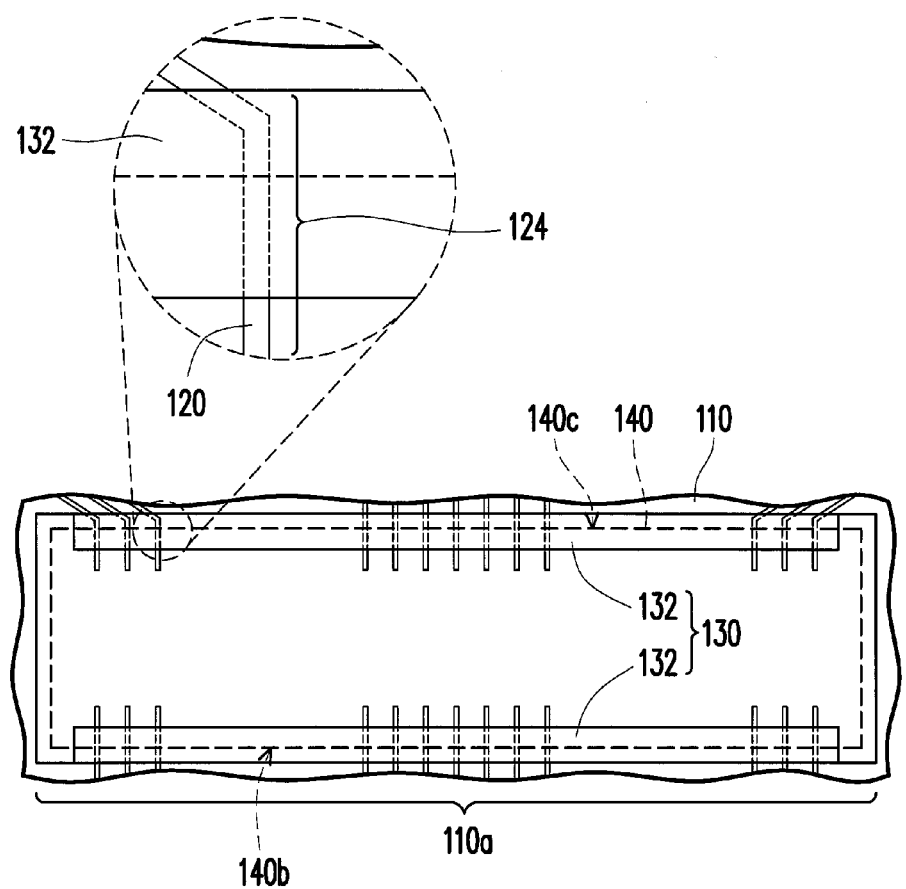
FIG. 5 is a top view diagram of the flexible substrate shown in FIG. 3.
Figure 6:
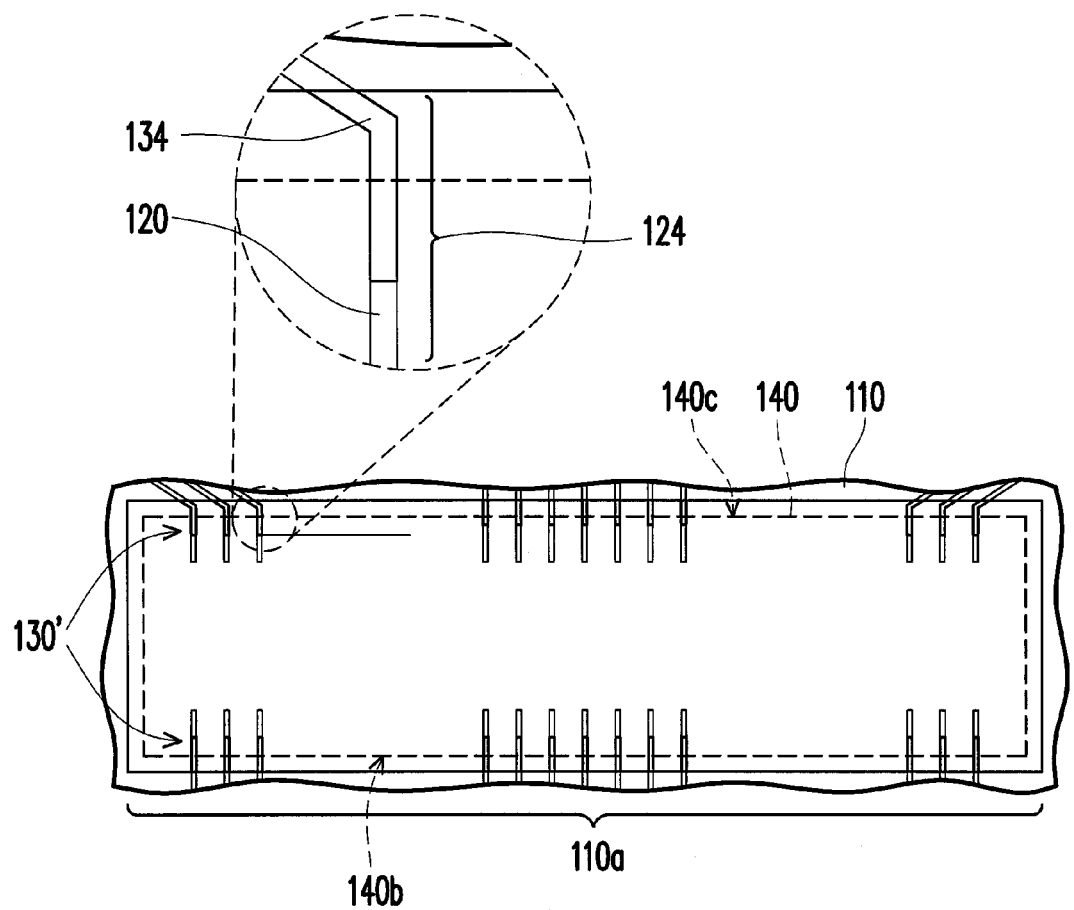
FIG. 6 is a top view diagram of a flexible substrate according to another embodiment of the invention.

FIG. 5 is a top view diagram of the flexible substrate shown in FIG. 3. As depicted in FIG. 5, the insulating layer 130 of the embodiment includes at least two insulating strips 132, and the two insulating strips 132 are respectively disposed on the inner lead portions 124 of the leads 120 arranged abreast along the two opposite edges 140b and 140c of the chip 140, that is to say, each of the insulating strips 132 continuously lays over the inner lead portions 124 of the leads 120 arranged abreast along either one of the edges 140b and 140c. FIG. 6 is a top view diagram of a flexible substrate according to another embodiment of the invention. Referring to FIG. 6, in the embodiment, an insulating layer 130' is composed of a plurality of insulating blocks 134, in which each of the insulating blocks 134 is respectively disposed on the inner lead portion 124 of one of the leads 120.

Figure 7:
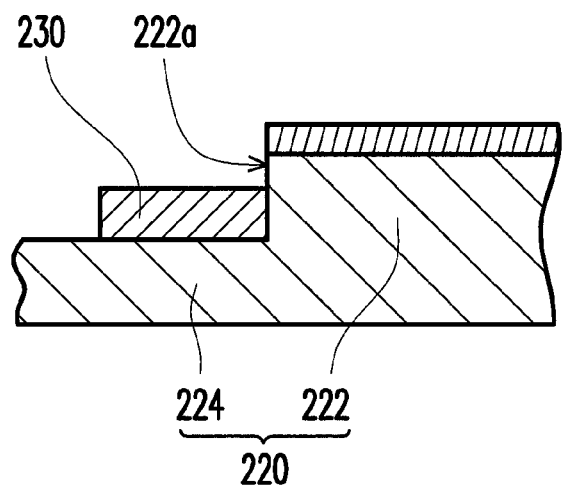
FIG. 7 is a partial cross-sectional diagram of a lead and an insulating layer according to yet another embodiment of the invention.
Figure 8:
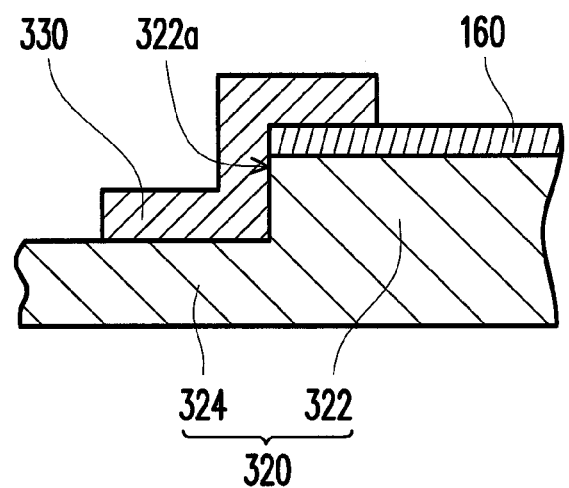
FIG. 8 is a partial cross-sectional diagram of a lead and an insulating layer according to yet another embodiment of the invention.

The invention does not limit the extending range of the insulating layer 130, which can be illustrated with the following examples. FIG. 7 is a partial cross-sectional diagram of a lead and an insulating layer according to yet another embodiment of the invention. Referring to FIG. 7, in contrast with the insulating layer 130 in FIG. 3 which extends over the inner lead portions 124 and further extends upwards to cover the sidewall surfaces 122a of the leads 120, the insulating layer 230 of the embodiment extends over the inner lead portions 224 but does not cover the sidewall surfaces 222a of the leads 220. FIG. 8 is a partial cross-sectional diagram of a lead and an insulating layer according to yet another embodiment of the invention. Referring to FIG. 8, in contrast with the insulating layer 130 in FIG. 3, the insulating layer 330 of the embodiment extends over the inner lead portions 324 and moves upwards to cover the sidewall surfaces 322a of the leads 320, and further extends onto the upper surfaces of the body portions 322 so as to cover a portion of the solder resist layer 160.

In summary, the lead in the present invention with the thicker body portion reinforces the structure strength of the leads and reduces the probability of the lead bending caused by the bonding force. In addition, by disposing the insulating layer on the inner lead portions of the leads to have the insulating layer corresponding to the seal ring on the chip in position, the insulating layer is hence interposed between the leads and the seal ring when the chip is bonded to the flexible substrate. Therefore, unexpected electric contact between the leads and the seal ring due to the warping of the flexible substrate and the bending of the leads can be avoided so that the probability of short-circuit of the chip package structure is reduced.

It will be apparent to those skilled in the art that various modifications and variations can be made to the structure of the invention without departing from the scope or spirit of the invention. In view of the foregoing, it is intended that the invention covers modifications and variations of this invention provided they fall within the scope of the following claims and their equivalents.

What is claimed is:

1. A chip package structure, comprising:
    a flexible substrate, having a chip mounting region;
    a plurality of leads, disposed on the flexible substrate, wherein each of the leads comprises a body portion and an inner lead portion connected to each other, the inner lead portion extends into the chip mounting region, and the body portion is located outside the chip mounting region and a thickness of the body portion is greater than a thickness of the inner lead portion;
    an insulating layer, disposed on the inner lead portions of the leads, wherein an upper surface of the insulating layer is not higher than a surface of the body portion; and
    a chip, having an active surface, wherein a plurality of bumps and a seal ring are disposed on the active surface, the seal ring is adjacent to edges of the chip, and the chip is mounted within the chip mounting region and electrically connects the flexible substrate by connecting the inner lead portions of the leads with the bumps correspondingly;
    wherein the insulating layer is corresponding to the seal ring in position when the chip is electrically connected to the flexible substrate.

2. The chip package structure as claimed in claim 1, wherein the bumps are arranged abreast along at least two opposite edges of the chip and adjacent to the at least two opposite edges, and the seal ring is located between the bumps and the at least two opposite edges of the chip.

3. The chip package structure as claimed in claim 2, wherein the insulating layer comprises at least two insulating strips, and the insulating strips are respectively disposed on the inner lead portions of the leads arranged abreast along the at least two opposite edges of the chip.

4. The chip package structure as claimed in claim 1, wherein the insulating layer comprises a plurality of insulating blocks and the insulating blocks are respectively disposed on the inner lead portions of the leads.

5. The chip package structure as claimed in claim 1, further comprising an encapsulant, disposed between the chip and the flexible substrate to cover the bumps and the seal ring.

6. The chip package structure as claimed in claim 1, further comprising a solder resist layer located outside the chip mounting region and partially covering the body portions of the leads.

7. The chip package structure as claimed in claim 1, wherein a joint between the body portion and the inner lead portion has a sidewall surface, and the insulating layer extends onto and is disposed on the sidewall surface.

8. The chip package structure as claimed in claim 1, wherein the thickness of the body portion is 1.2 to 2 times larger than that of the inner lead portion.

9. The chip package structure as claimed in claim 1, wherein a height of the bumps is greater than a thickness sum of the seal ring and the insulating layer.

10. The chip package structure as claimed in claim 1, wherein the flexible substrate is adapted to be used as a substrate for chip-on-film package or tape carrier package.

* * * * *